United States Patent [19]

Shen et al.

[11] Patent Number: 4,727,316
[45] Date of Patent: Feb. 23, 1988

[54] TRANSFORMER CURRENT SENSOR FOR SUPERCONDUCTING MAGNETIC COILS

[75] Inventors: Stewart S. Shen, Oak Ridge; C. Thomas Wilson, Norris, both of Tenn.

[73] Assignee: The United States of America as represented by the United States Department of Energy, Washington, D.C.

[21] Appl. No.: 723,674

[22] Filed: Apr. 16, 1985

[51] Int. Cl.⁴ .......................... G01R 1/20; H01F 27/28
[52] U.S. Cl. .................................. 324/127; 336/84 C; 336/181; 336/182
[58] Field of Search ........... 324/127; 336/84 C, 84 R, 336/181, 182, DIG. 1; 335/216; 336/129

[56] References Cited

U.S. PATENT DOCUMENTS

| 1,665,947 | 4/1928 | Brennan | 336/181 |
| 2,452,862 | 11/1948 | Neff | 336/129 |
| 3,312,919 | 4/1967 | Ross | 336/84 C |

FOREIGN PATENT DOCUMENTS 0083016 7/1978 Japan .................................. 336/129

OTHER PUBLICATIONS

S. S. Shen et al., "Pulse Loss and Voltage Measurements on Superconducting Magnets", *IEEE Transactions on Magnetics*, vol. MAG-13, No. 1 (Jan. 1977), pp. 855–858.

V. Nassisi et al., "Rogowski Coils: Theory and Experimental Results", *Rev. Sci. Instru.*, vol. 50, No. 7, Jul. 1979, pp. 900–902.

Primary Examiner—Ernest F. Karlsen
Attorney, Agent, or Firm—David E. Breeden; Stephen D. Hamel; Judson R. Hightower

[57] ABSTRACT

A transformer current sensor having primary turns carrying a primary current for a superconducting coil and secondary turns only partially arranged within the primary turns. The secondary turns include an active winding disposed within the primary turns and a dummy winding which is not disposed in the primary turns and so does not experience a magnetic field due to a flow of current in the primary turns. The active and dummy windings are wound in opposite directions or connected in series-bucking relationship, and are exposed to the same ambient magnetic field. Voltages which might otherwise develop in the active and dummy windings due to ambient magnetic fields thus cancel out. The resultant voltage is purely indicative of the rate of change of current flowing in the primary turns.

9 Claims, 7 Drawing Figures

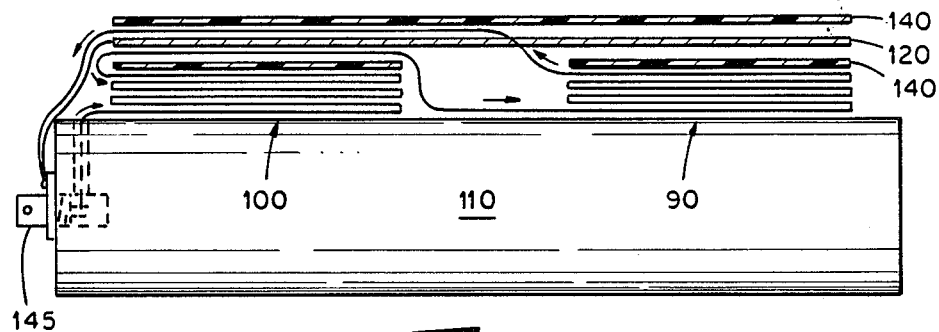
_Fig. 4A_
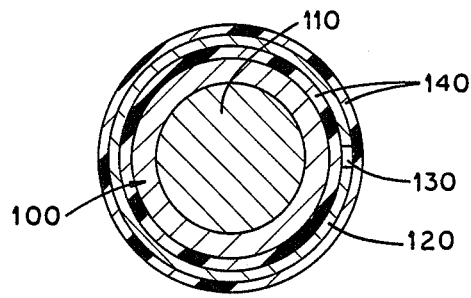
_Fig. 4B_
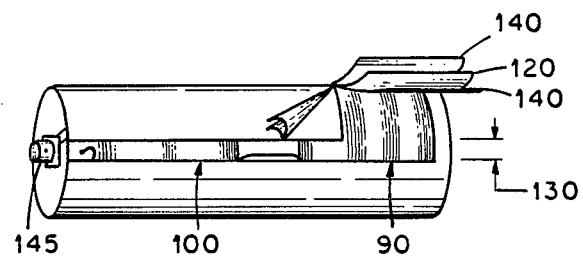
_Fig. 4C_

TRANSFORMER CURRENT SENSOR FOR SUPERCONDUCTING MAGNETIC COILS

BACKGROUND OF THE INVENTION

This invention pertains to a device for sensing rate of change of current in high amperage highly inductive loads, and more specifically to quench detection devices for superconducting magnet coils.

Large superconducting magnet coils are currently being designed and tested for possible use in fusion reactor devices. These magnets are very expensive. A condition which can damage or destroy such a magnet is the sudden appearance of a zone of normal ohmic resistivity in the otherwise superconducting coil. Such a zone, known as a "quench," quickly heats up due to ohmic heating, causing adjacent zones to revert to normal ohmic resistivity. The overall process is thus self-propagating and can avalanche into a dangerously large, if not complete, loss of superconductivity. This can seriously damage the coil.

Thus, it is necessary that a quench be detected at its onset and that appropriate protective measures be taken. Such protective measures typically include switching energy dump resistors into the magnet circuit, or disconnecting the coil from its power supply.

The impedance of a normal coil has both inductive and resistive (ohmic) components. The impedance of a superconducting coil, on the other hand, is ideally purely inductive. At the onset of a quench, however, the impedance of the superconducting coil acquires a small ohmic component. The ohmic component is much smaller than the inductive component. The challenge in detecting a quench is therefore to detect this small ohmic component in the impedance (and, hence, in the voltage drop across the coil) in the presence of the large inductive component. To oversimplify, this is usually accomplished by developing a signal indicative of the voltage drop attributable to the inductive component of the impedance and subtracting that signal from the total voltage drop or loss. The difference thus calculated corresponds to the ohmic contribution to the voltage loss.

FIG. 1 is a schematic diagram of a Rogowski coil 10, which is a known device for detecting a quench. The Rogowski coil 10 is usually arranged as shown, i.e., enclosing a segment 20 of a primary current carrying element of the magnet system carrying primary current I. A Rogowski coil has the advantage of being able to cancel inductive voltages which originate from ambient magnetic fields other than that originating from the current carrying element. The voltage $V_M$ induced in the Rogowski coil thus indicates the rate of change of current flowing through the primary current carrying element, and is used to develop the signal indicative of the voltage loss attributable to the inductive component of the overall impedance.

While Rogowski coils have served well in measuring currents associated with smaller operating currents, problems have been encountered attempting to scale such coils up to provide a current transformer for operating currents such as are contemplated for fusion applications. First, it is difficult to construct a Rogowski coil of the needed size. Second, even when such a Rogowski coil of the needed size is made, it fails to perform at specified levels.

SUMMARY OF THE INVENTION

The present invention is a current transformer for operating currents larger than 2 kA (two kiloamps) that is capable of detecting a millivolt level resistive voltage in the presence of a large inductive voltage. Specifically, the present invention includes substantially cylindrical primary turns arranged to carry a primary current and substantially cylindrical secondary turns arranged coaxially with and only partially within the primary turns, the secondary turns including an active winding and a dummy winding, the active and dummy windings being coaxial, longitudinally separated and arranged to mutually cancel voltages excited by commonly experienced magnetic fields, the active winding but not the dummy winding being arranged within the primary turns.

BRIEF DESCRIPTION OF THE DRAWINGS

These and further features of the present invention will be better understood from the following description when read in conjunction with the drawings, in which:

FIG. 4A is a diagram showing the construction of the secondary turns of a current sensor according to the present invention;

FIG. 4B is a cutaway end view taken along line 4B—4B of FIG. 2 showing further details of construction of the secondary windings;

FIG. 4C is a diagram showing still more details of current sensor secondary turns.

DETAILED DESCRIPTION OF THE PREFERRED EMBODIMENTS

Figure 1:
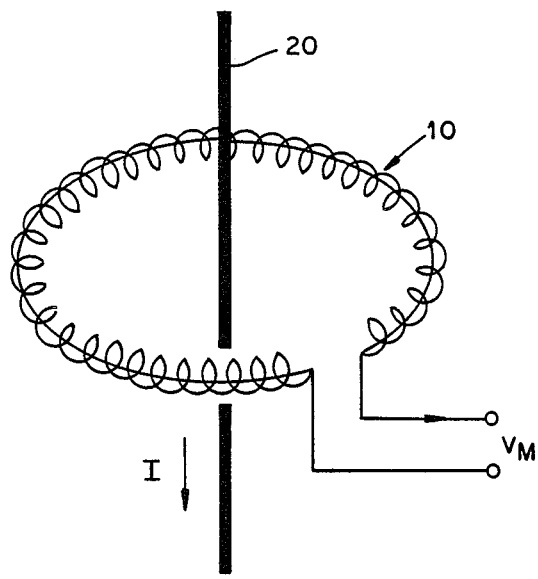
FIG. 1 is a schematic diagram of a Rogowski coil described above in the Background section.
Figure 2:
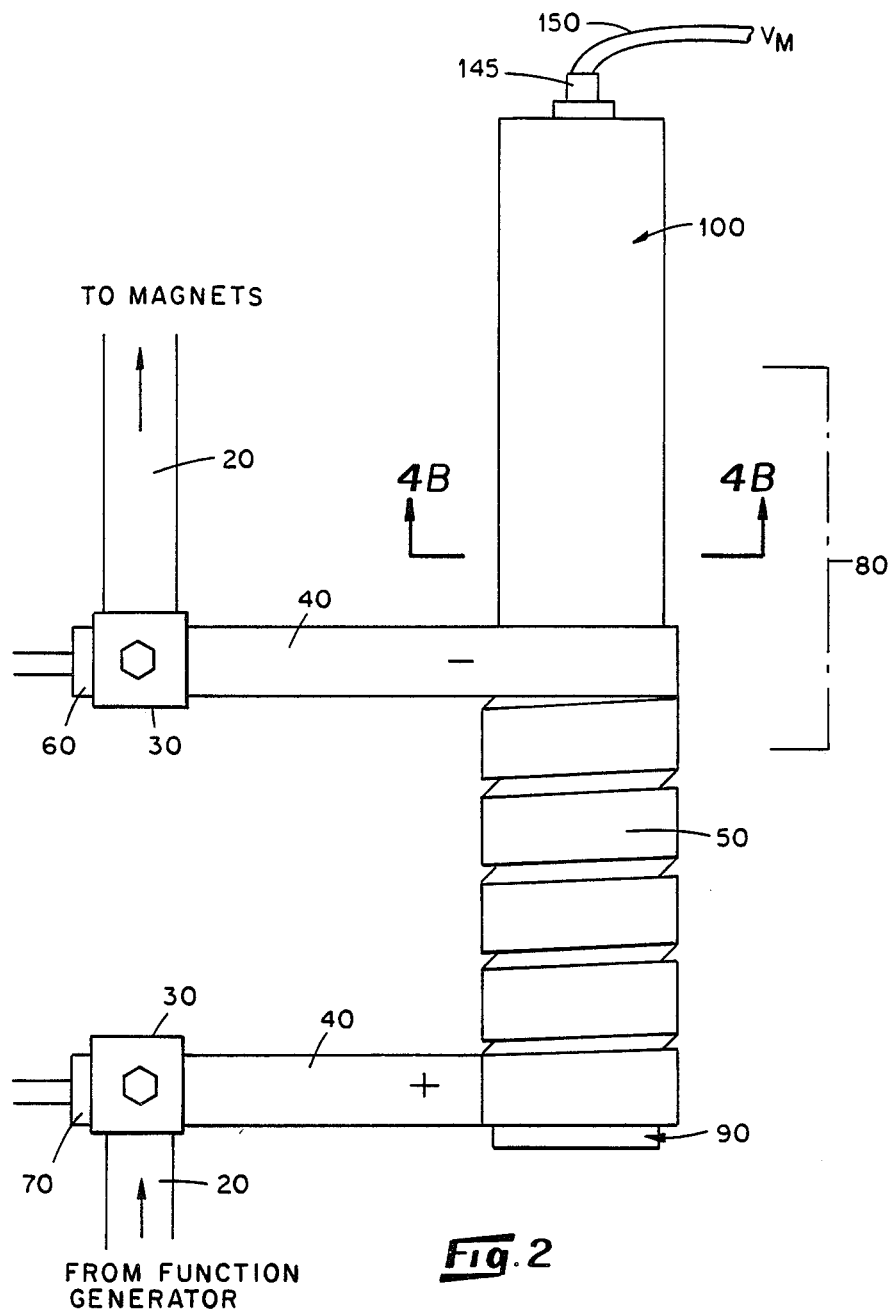
FIG. 2 is a front elevational view of a current transformer according to the present invention.

FIG. 2 is a front elevational view of a current transformer according to the present invention. Numeral 20 designates, as it did in FIG. 1, a segment of a primary current carrying element. The segments 20 in FIG. 2 are each connected by connector 30 to a primary bus 40.

Primary bus 40 includes a set of helical or cylindrical turns defining primary turns 50. The number of turns in primary turns 50 will be understood to vary depending on the requirements of the contemplated application. In general, the choice of number of turns will represent a trade-off between sensitivity (more turns) and the size and cost of the device (fewer turns). In the preferred embodiment, the primary turns comprise six turns. The turns are approximately 0.15 to 0.17 inches apart. In the preferred embodiment, primary bus 40 is made of 1" square copper tubing. With six turns having approximately 1/6" clearance therebetween, the total length of primary turns 50 is thus approximately 7 inches.

Figure 5:
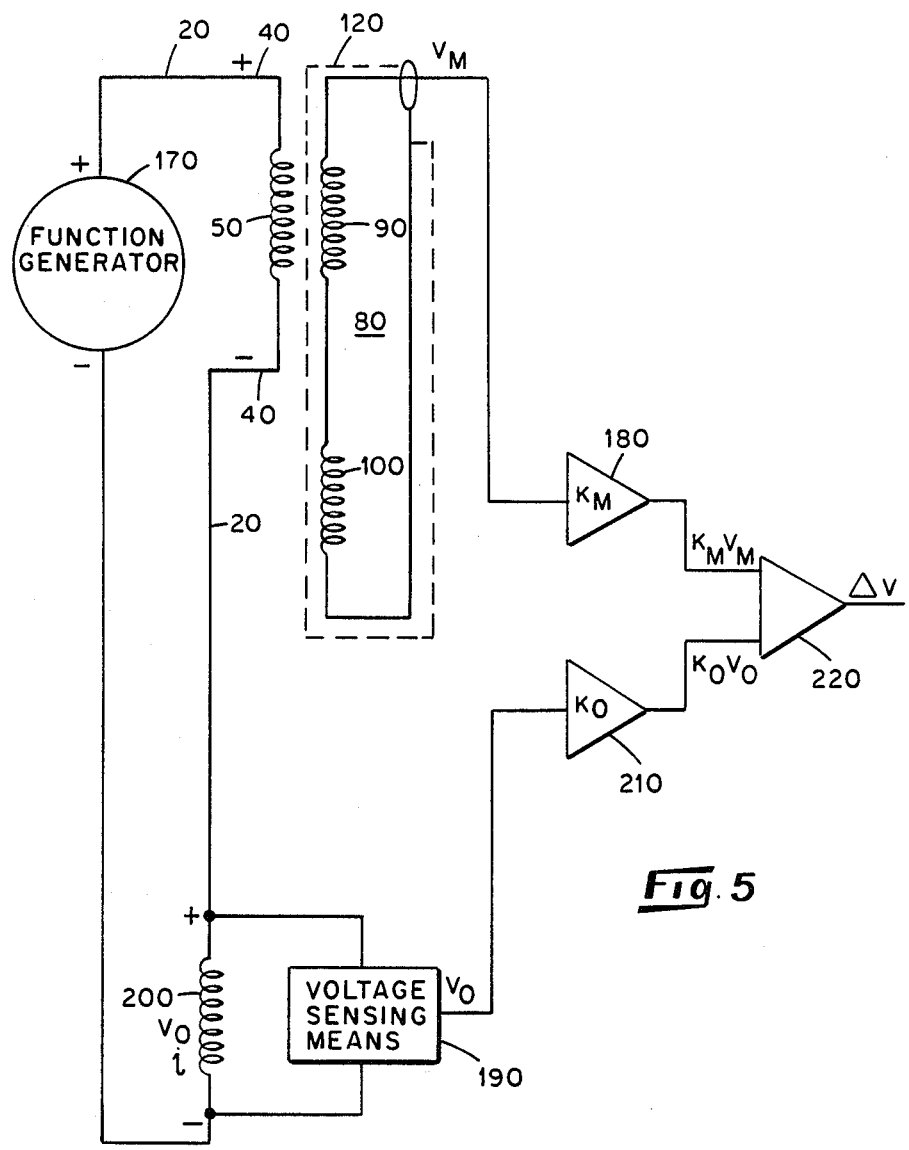
FIG. 5 is a circuit diagram of a current transformer according to the present invention.

The primary current carrying element supplies power to a superconducting magnetic coil (see FIG. 5). Thus, primary turns 50 are in series with the superconducting magnetic coil, and the current flowing through primary turns 50 is precisely the same as that flowing through the coil.

Although segments of only one primary current carrying element are shown connected to primary bus 40 in FIG. 2, it will be understood by one having ordinary skill in the art that the number of such elements connected to primary bus 40 will in general correspond to the number of superconducting coils in which a quench is to be detected.

The primary bus is preferably water-cooled by circulating cooling water through the copper tubing which makes it up by means of a water inlet 60 and a water outlet 70.

For currents in the 2 kA range, a power bus made of copper tubing such as that just described need not be insulated. The rigidity of the hollow copper bus material is sufficient to resist displacement by any physical forces resulting from by the magnetic and electric fields it develops. For greater currents or less rigid bus materials, it may be desirable to insulate the primary turns 50.

Figure 3:
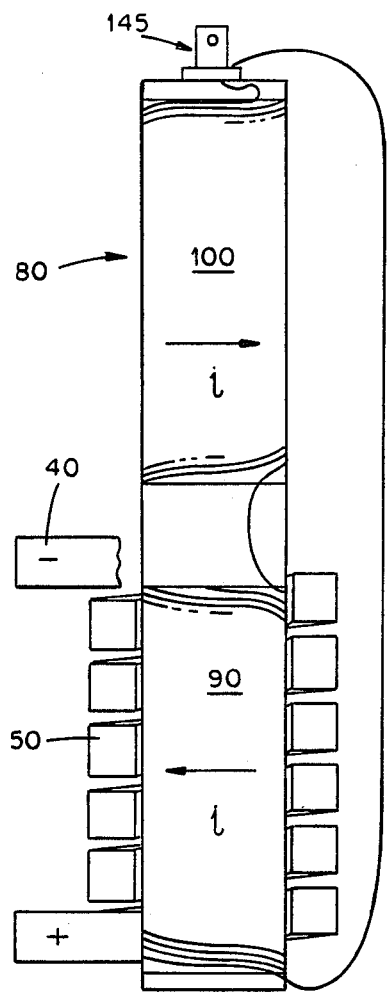
FIG. 3 is a partially cutaway view of the structure shown in FIG. 2.

Details of the construction of secondary turns 80 will now be described with reference to FIGS. 3 and 4A–4C. FIG. 3 is an illustration of the secondary turns 80 with primary turns 50 cut away and insulating and shielding layers (to be described later) removed. The secondary turns 80 can be seen to comprise two windings, active winding 90 and dummy winding 100. Active winding 90 is inserted into the center of primary turns 50 and is substantially longitudinally coextensive therewith. Dummy winding 100 is longitudinally separated from active winding 90 and not inserted into the center of primary turns 50. In this sense, the secondary turns 80 are arranged partially within the primary turns 50.

The construction of the active winding 90 and the dummy winding 100 is essentially identical. Both coils are wound on a cylindrical mandrel 110 (see FIGS. 4A and 4B) which is arranged to be coaxial with primary turns 50. In the preferred embodiment, each winding is approximately 7 inches long (about the same length as primary turns 50), and wound with 6 layers to result in a turn density of 250 turns/inch. Thus, each winding comprises approximately 10,500 turns. The diameter of the windings is about 3 inches.

Active winding 90 and dummy winding 100 are arranged with respect to one another to mutually negate or cancel out voltages excited by any commonly-experienced magnetic field. It will be apparent to one of ordinary skill in the art that this can be accomplished in at least two ways. First, the windings may be wound in reverse directions. Alternatively, they may be electrically connected backwards in series-bucking relationship so that each "bucks out" the voltage induced in the other. The commonly-experienced magnetic field in the context of the present invention is the ambient magnetic field, the contribution of which it is desired to eliminate.

The two windings are longitudinally separated so that the dummy winding will not be influenced by magnetic fields generated by the flow of current passing through primary turns 50. In the preferred embodiment, the windings are separated by approximately 2 inches.

The preferred embodiment also has a one-half inch clearance between the end of a winding and the end of the mandrel 110. Thus, the total length of mandrel 110 is about 17 inches.

One of ordinary skill in the art will readily appreciate that many of these dimensions and parameters are arbitrary or selected either to use readily-available materials or for the particular application of the current sensor. As with primary turns 50, more secondary turns would increase sensitivity but also cost and size. For any given application, overall lengths are therefore probably best determined based upon sensitivity space, and cost considerations.

Some details of winding and connection to the windings are also discernible in FIG. 3. The windings are electrically interconnected at one end across the longitudinal separation in series-bucking relationshp. (More details on this will be described in connection with FIG. 4A.) The other end of one winding is connected to a center lead of a connector 145, which is preferably a standard coaxial-type connector. The other end of the other winding is connected to the shield of connector 145. In the depicted embodiment, the dummy winding 100 is connected to the center lead and the active winding 90 is connected to the shield, but this particular arrangement is not crucial and can just as easily be reversed.

FIG. 4A shows in diagramatic form the winding details for secondary windings 80. As seen therein, the windings are interconnected in series-bucking relationship (end to end and or in opposing polarties) so that no net voltage will be produced by any commonly-experienced magnetic field. The connections with connector 45 are also clearly visible.

FIG. 4A also provides information concerning insulation and shielding for secondary turns 80. Numeral 140 designates an insulating layer of a very good insulator (such as Kapton (R), commercially available as a tape from E. I. DuPont de Nemours & Co.). These insulating layers are arranged to cover all of secondary turns 80. Sandwiched in between the insulating layers 140 is an electrostatic shield layer 120. This layer is provided to prevent any stray electric fields from undesirably influencing excitation of voltages in secondary turns 80. Layer 120 is conductive and can be made, for example, made of copper foil. As will be described below, layer 120 does not entirely encircle secondary turns 80. Layer 120 is grounded by electrically connecting it to the shield of connector 145.

FIG. 4B is an end-on cutaway view showing the various layers and other structural elements. At the center is mandrel 110. Next in a radially outward direction is dummy winding 100, an insulating layer 140, electrostatic shielding or shield layer 120, and another insulating layer 140. As can be seen, shield layer 120 has a longitudinal gap 130. This gap is provided to avoid creating a circuit around the winding which could act as an encircling path for current. In the preferred embodiment, gap 130 is about one-quarter of an inch wide.

FIG. 4C provides an additional view of the structural interrelationship of the windings and various layers. Although the layers have been separated to simplify illustration, the insulating layers 140 cover all of the windings including the longitudinal gap 130.

A voltage signal $V_M$ induced in secondary turns 80 by the flow of current through primary turns 50 is carried by signal line 150 to processing circuitry best seen in FIG. 5.

FIG. 5 is a schematic diagram of the transformer current sensor in an overall measuring system. Function generator 170 provides a current pulse which passes through primary bus 40 and primary turns 50. The magnetic field produced by the flow of current through primary turns 50 excites a voltage in active winding 90 of secondary turns 80. Any voltage excited in active winding 90 by ambient or background magnetic fields is negated or "bucked out" by an opposing voltage excited by the same ambient fields in dummy winding 100.

The resultant signal $V_M$ is amplified by first isolation amplifier 180 having a gain $K_M$.

Concurrently, a voltage sensing means 190 senses the voltage drop across a superconducting magnet coil 200 and generates a signal $V_O$ which is indicative of the sensed voltage. The signal $V_O$ is then used as an input for a second amplifier 210 having a gain $K_O$. The output of the first isolation amplifier 180, $K_M V_M$, and the output of second amplifier 210, $K_O V_O$, are fed to a differential amplifier 220. The output of differential amplifier 220, $\Delta V$, is the compensated voltage loss signal, which is used in a known fashion to detect quenching.

The compensated loss voltage signal $\Delta V$ is related to operational parameters of the superconducting coil in a known manner. For example, such details are available in S. Shen and H. Yen, "Pulse Loss Voltage Measurements in Superconducting Magnets," *IEEE Transactions on Magnetics*, Vol. MAG-13, No. 1, January 1977.

A transformer current sensor according to the present invention has many advantages over the traditional Rogowski coil. These include that the invention meets the performance requirements for superconducting magnet testing applications. The invention can also be scaled up to measure primary currents and to generate output signals which would not be practical or, for some common geometries, possible with a Rogowski coil. Also, the simple design of the present invention makes it easy to manufacture.

An improved transformer current sensor has been described above in terms of specific embodiments in a specific application. It will be readily apparent to one possessing ordinary skill in the art that the present invention will prove advantageous in other embodiments or applications. The invention is therefore not to be construed as being limited to the exemplary embodiments or application, but instead should be deemed to be commensurate in scope with the following claims.

What is claimed is:

1. a transformer current sensor for detecting resistance voltage losses in a superconducting coil comprising:
    cylindrical primary terms arranged in series with said superconducting coil to carry a primary current; and
    cylindrical secondary terms including an active winding and a dummy winding, said active winding and said dummy winding being coaxial, of substantially the same construction and arranged to mutually negate voltages induced by any commonly experienced magnetic field, said active winding but not said dummy winding being fixedly arranged coaxially within and substantially longitudinally coextensive with said primary turns, and said dummy winding being longitudinally separated form said active winding sufficient distance that said dummy winding is not influenced by magnetic fields generated by said primary current passing through said primary turns.

2. A current sensor as claimed in claim 1 wherein said primary turns comprise a power bus having approximately six helical turns, and said active winding and said dummy winding each comprise approximately 10,500 turns about a common mandrel.

3. A current sensor as claimed in claim 2 wherein said power bus is water-cooled.

4. A current sensor as claimed in claim 1 further comprising electrostatic shielding substantially surrounding said secondary turns.

5. A current sensor as claimed in claim 4 wherein said electrostatic shielding comprises copper foil affixed to said secondary turns and covering said secondary turns except for a longitudinal section of said secondary turns.

6. A current sensor as claimed in claim 4 further comprising an insulating layer surrounding said electrostatic shielding.

7. A current sensor as claimed in claim 1 further comprising:
    means for sensing a voltage drop across said superconducting coil and for generating a signal $V_O$ indicative of said sensed voltage drop;
    first amplifying means responsive to said secondary turns for amplifying a signal $V_M$ produced across said secondary turns;
    second amplifying means, responsive to said sensing means for amplifying said signal $V_O$; and
    differential amplifying means, responsive to said first and second amplifying means, for generating a differential signal indicative of a difference between said amplified $V_O$ signal and said amplified $V_M$ signal.

8. A current sensor as claimed in claim 1 wherein said active and dummy windings are arranged to mutually negate voltages induced by commonly-experienced magnetic fields by being wound in opposite directions and electrically connected in series.

9. A current sensor as claimed in claim 1 wherein said active and dummy windings are arranged to mutually negate voltages induced by commonly-experienced magnetic fields by being wound in the same direction and electrically connected in series-bucking relationship.

* * * * *